(12) United States Patent
Clevenger et al.

(10) Patent No.: US 6,787,836 B2
(45) Date of Patent: Sep. 7, 2004

(54) INTEGRATED METAL-INSULATOR-METAL CAPACITOR AND METAL GATE TRANSISTOR

(75) Inventors: Lawrence A. Clevenger, LaGrangeville, NY (US); Louis L. Hsu, Fishkill, NY (US); Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 25 days.

(21) Appl. No.: 10/224,899

(22) Filed: Aug. 21, 2002

(65) Prior Publication Data

US 2004/0038474 A1 Feb. 26, 2004

(51) Int. Cl.[7] .............................................. H01L 27/108
(52) U.S. Cl. ...................................... 257/296; 257/300
(58) Field of Search ......................................... 438/397

(56) References Cited

U.S. PATENT DOCUMENTS

| | | | |
|---|---|---|---|
| 5,903,493 A | 5/1999 | Lee | |
| 6,033,963 A | 3/2000 | Huang et al. | |
| 6,049,114 A | 4/2000 | Maiti et al. | |
| 6,057,583 A | 5/2000 | Gardner et al. | |
| 6,130,123 A | 10/2000 | Liang et al. | |
| 6,165,858 A | 12/2000 | Gardner et al. | |
| 6,198,617 B1 | 3/2001 | Sun | |
| 6,341,056 B1 * | 1/2002 | Allman et al. | 361/312 |
| 6,451,667 B1 * | 9/2002 | Ning | 438/397 |
| 6,528,834 B1 * | 3/2003 | Durcan et al. | 257/296 |

OTHER PUBLICATIONS

"New Paradigm of Silicon Technology", Tadahiro Ohmi, Shigrtoshi Sugawa, Koji Kotani, Masaki Hirayama, Akihiro Morimoto. Proceedings of the IEEE, vol. 89, No. 3, Mar. 2001, pp. 394–412.

"Dual–Metal Gate Technology for Deep–Submicron CMOS Transistors", Qiang Lu, Vee Chia Yeo, Pushkar Ranade, Hideki Takeuchi, Tsu–Jae King, Chenming Hu, S.C. Song, H.F. Luan, Dim–Lee Kwong. 2000 Symposium on VLSI Technology Digest of Technical Papers, 2000 IEEE, pp. 72–73.

"Dual–Metal Gate CMOS Technology with Ultrathin Silicon Notride Gate Dielectric", Yee–Chia Yeo, Qiang Lu, Pushkar Ranade, Hideki Takeuchi, Kevin J. Yang, Igor Polishchuk, Tsu–Jae King, Chenming Hu, S.C. Song, H.F. Luan, Dim–Lee Kwong, IEEE Electron Device Letters, vol. 22, No. 5, May 2001. Pp. 227–229.

"New Paradigm of Silicon Technology," Tadahiro Ohmi, et al., Proceedings of the IEEE, vol. 89, No. 3, Mar. 2001, pp. 394–412.

"Dual–Metal Gate CMOS Technology with Ultrathin Silicon Nitride Gate Dielectric," Yee–Chia Yeo et al., IEEE Electron Device Letters, vol. 22, No. 5, May 2001, pp. 227–229.

"Dual–Metal Gate Technology for Deep–Submicron CMOS Transistor," Qiang Lu et al., IEEE 2000 Symposium on VLSI Technology Digest of Technical Papers, pp. 72–73.

* cited by examiner

Primary Examiner—David Nelms
Assistant Examiner—Thao P. Le
(74) Attorney, Agent, or Firm—McGinn & Gibb, PLLC; Wan Yee Cheung, Esq.

(57) ABSTRACT

An integrated circuit structure is disclosed that comprises a pair of capacitors, each having metal plates separated by an insulator, and metal gate semiconductor transistors electrically connected to the capacitors. The metal gate of the transistors and one of the metal plates of each of the capacitors comprise the same metal level in the integrated circuit structure. More specifically, each of the capacitors comprise a vertical capacitor having an upper metal plate vertically over a lower metal plate and each metal gate of the transistors and each upper metal plate of the capacitors comprise the same metal level in the integrated circuit structure.

12 Claims, 5 Drawing Sheets

INTEGRATED METAL-INSULATOR-METAL CAPACITOR AND METAL GATE TRANSISTOR

BACKGROUND OF THE INVENTION

1. Field of the Invention

The present invention generally relates to microelectronic circuits, and more particularly to a microelectronic circuit and device having metal-insulator-metal capacitors.

2. Description of the Related Art

In today's dynamic random access memory (DRAM) environment, achieving high density is of the utmost concern. As the DRAM size continues to grow larger, its performance becomes a concern. Therefore, it is critical to improve the performance of the DRAM, especially for short-cycle, high-speed embedded DRAMs. In order to compete with the technological embodiments of static random access memories (SRAMs), there are many performance breakthroughs which must occur to the DRAMs. One such breakthrough is to further reduce the DRAM size. The size of a DRAM macro is about 10 to 15 times smaller than that of SRAM with the same capacity. Moreover, the smaller the size, the less the delay. Unlike conventional stand-alone DRAMs, the size of erasable DRAM (eDRAM) is more difficult to reduce, which increases the process cost.

A Metal-Insulator-Metal (MIM) capacitor is commonly used as a decoupling capacitor in semiconductors. An MIM capacitor includes a lower and an upper electrode made of conducting materials such as polysilicon, metals, or metal alloys. Also, sandwiched between the electrodes is a thin layer of dielectric such as silicon nitride, silicon oxynitride, silicon oxide, or high-k materials such as aluminum oxide, tantalum pentoxide, titanium dioxides, barium strontium titanate, etc.

MIM capacitors can be added as discrete components to a chip, and are usually added at the terminal metal layer. More advance versions of MIM capacitors can be integrated on a chip die, for example in-between various back-end-of-the-line levels where they can provide a more efficient decoupling function and have a smaller tendency to introduce external noise due to closer contacts to the silicon level of the transistor. Two conventional designs are shown in U.S. Pat. Nos. 5,903,493 and 6,198,617, the complete disclosures of which are herein incorporated by reference. In these devices the capacitor element is above the metal regions M1.

It has been recognized that as chip sizes continue to become smaller and smaller, there is a need to move from a conventional poly gate structure to a metal gate structure. (See for example, "New Paradigm of Silicon Technology," Tadahiro Ohmi, et al., Proceedings of the IEEE, Vol. 89, No. 3 March 2001, pp 394–412; "Dual-Metal Gate CMOS Technology with Ultrathin Silicon Nitride Gate Dielectric," Yee-Chia Yeo et al., IEEE Electron Device Letters, Vol. 22, No. 5, May 2001, pp 227–229; "Dual-Metal Gate Technology for Deep-Submicron CMOS Transistor," Qiang Lu, et al., IEEE 2000 Symposium on VLSI Technology Digest of Technical Papers, pp 72–73; U.S. Pat. No. 6,057,583 "Transistor with Low Resistance Metal Source and Drain Vertically Displaced From the Channel" issued to Gardner, et al.; U.S. Pat. No. 6,165,858 "Enhanced Silicidation Formation for High Speed MOS Device by Junction Grading with Dual Implant Dopant Species" issued to Gardner, et al.; U.S. Pat. No. 6,033,963 "Method of Formning a Metal Gate for CMOS Devices Using a Replacement Gate Process" issued to Huang, et al.; U.S. Pat. No. 6,130,123 "Method for Making a Complementary Metal Gate Electrode Technology" issued to Liang, et al.; U.S. Pat. No. 6,049,114 "Semiconductor Device Having a Metal Containing Layer Overlying a Gate Dielectric" issued to Maiti, et al., the complete disclosures of which are herein incorporated by reference.

Moreover, depending on the circuit design, the choice of gate material can have a work function matching that of a P-type silicon or a N-type silicon structure, or a work function between a P-type and N-type structure, which is denoted as a mid-gap metal. Typical examples of these three groups of gate materials are Ni, TaN, RuO and MoN; Ru, Ta and TaSi; and W, respectively. Similar conducting materials can be used on the source and drain regions of the silicon thereby taking advantage of using one of these metal contacts as the lower electrode for an MIM capacitor, which can significantly reduce the physical space over the conventional poly gate electrodes and MIM capacitor combination.

Thus, there is a need for a new device which utilizes a metal contact as a dual electrode to the source/drain of the transistor and the lower electrode of a MIM capacitor. Moreover, there is a need for a new device which offers a much higher packing density, yet does not have the other problems associated with conventional transistor devices.

SUMMARY OF THE INVENTION

In view of the foregoing and other problems, disadvantages, and drawbacks of the conventional transistor devices, the present invention has been devised, and it is an object of the present invention to provide a structure and method for fabricating microelectronic circuits having metal gates as well as metal contact capacitors. Another object of the present invention is to significantly reduce the processing costs of fabricating such devices by sharing processing steps and materials between the metal gates and metal capacitors. Yet another object of the present invention is to utilize the method by using high density DRAM.

In order to attain the objects suggested above, there is provided, according to one aspect of the invention an integrated circuit structure comprising a pair of capacitors, each having metal plates separated by an insulator, and metal gate semiconductor transistors electrically connected to the capacitors. The metal gate of the transistors and one of the metal plates of each of the capacitors comprise the same metal level in the integrated circuit structure. More specifically, each of the capacitors comprises a vertical capacitor having an upper metal plate vertically over a lower metal plate and each metal gate of the transistors and each upper metal plate of the capacitors comprise the same metal level in the integrated circuit structure. Further, each of the transistors includes a drain region connected to a respective lower metal plate of an adjacent capacitor.

The invention also provides a method of forming a metal-insulator-metal capacitor and an associated semiconductor transistor having a metal gate. The method patterns sacrificial gate structures over a substrate, forms sidewall spacers adjacent the sacrificial gate structures, forms a first metal layer adjacent the sidewall spacers, planarizes the first metal layer, removes the sacrificial gate structures, forms an insulator over the first metal layer, removes a portion of the first metal layer from a gate region, and forms a second metal layer over the insulator and in the gate region. The second metal layer comprises both the gate of the transistor and a plate of the transistor.

The planarizing of the first metal layer reduces voids and surface irregularities in the second metal layer. The insulator comprises both a capacitor insulator and a gate insulator. In addition, after forming the sidewall spacers, the invention dopes source and drain regions in the substrate.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF PREFERRED EMBODIMENTS OF THE INVENTION

For eDRAM, not only must the performance of DRAM be improved, but the performance of the other logic circuits, such as the CPU, must also be improved for overall system performance to improve. The current trend of using a metal gate for both the DRAM and support circuits for embedded applications is well known. Using a metal capacitor (such as a MIM) for the DRAM and support circuits saves chip size, especially when a high-k dielectric material is incorporated. High-k (dielectric constant) materials such as aluminum oxide, tantalum pentoxide, titanium dioxides, barium strontium titanate, or other ferroelectric materials are compatible with metal plates. The following describes a process to form a metal gate and metal contact capacitor side-by-side in a DRAM cell configuration. However, the embodiment shown below is merely exemplary and, as would be known by one ordinarily skilled in the art, the invention is equally applicable to other structures such as support circuits where a capacitor is needed.

Figure 1:
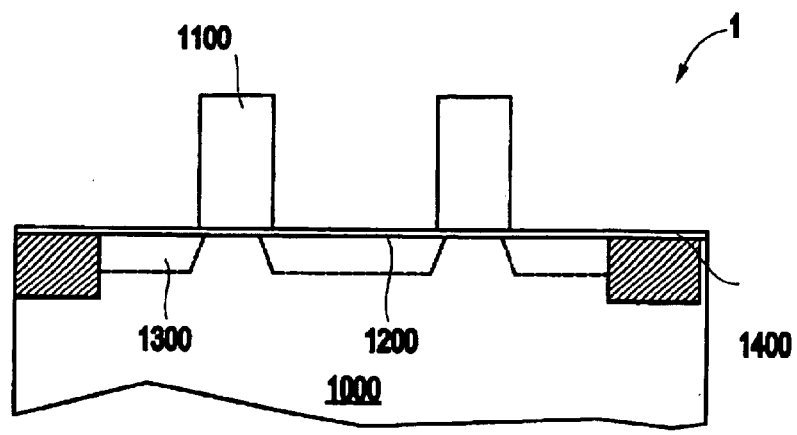
FIG. 1 is a cross-sectional view schematic diagram of a partially completed microelectronic device.

Referring now to the drawings, and more particularly to FIG. 1, shown is a partially completed microelectronic device 1 comprising a substrate 1000, shallow trench isolation (STI) regions 1400, a gate insulator such as a thin sacrificial oxide layer 1200 over the STI regions 1400, the substrate 1000, and gate electrodes 1100 positioned over the gate insulator 1200. The substrate 1000 preferably includes an impurity doping well 1300, such as a silicon wafer, or silicon-on-insulator wafer. The STI regions 1400 are formed by conventional processing such as photolithography patterning, dry etching to a depth below the semiconductor junctions formed in subsequent processing steps as is known to those skilled in the art, oxide fill deposition, and planarization such as chemical mechanical polish (CMP). The thin sacrificial oxide 1200 is formed on the substrate 1000 followed by the formation of oxide dummy gate patterns 1100 having an oxide thickness from 1 μm to 3 μm. The dummy gate preferably has a high-aspect ratio (e.g., 10 to 30) to reduce defects and voids in the planarization processes described below.

Figure 2:
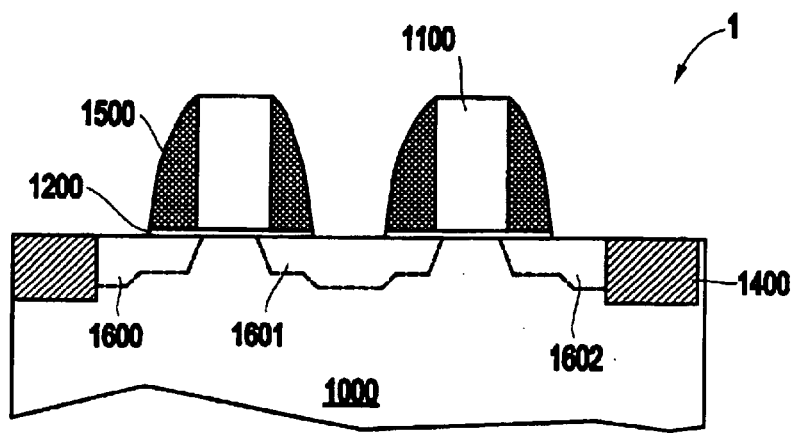
FIG. 2 is a cross-sectional view schematic diagram of a partially completed microelectronic device.

FIG. 2 shows nitride sidewall spacers 1500 that are formed on the sidewalls of each of the gate patterns 1100 using a conventional process such as deposition and etching. It is desirable for the spacer thickness to be in the range of a minimal lithographic feature size to help reduce circuit size. Further, FIG. 2 illustrates the effects of additional impurity implants which convert lightly doped regions 1300 into more heavily doped regions 1600, 1601, and 1602 which will eventually form the source/drain regions of the transistor.

Figure 3:
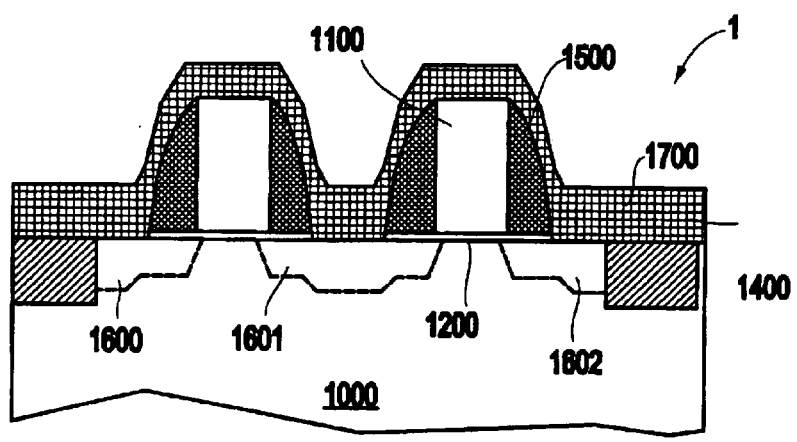
FIG. 3 is a cross-sectional view schematic diagram of a partially completed microelectronic device.

In FIG. 3, a first metal layer 1700 is deposited on the substrate 1000, the sidewall spacers 1500, the gate electrode 1100, and the STI regions 1400 using any conventional method including CVD, sputter, etc. This deposition comprises either a metal (as shown) which has a low reactivity with silicon or a bilayer structure. With a bilayer structure, a thin diffusion barrier layer such as TiN is deposited followed by a bottom node plate for the capacitor electrode. The diffusion barrier prevents the node plate material from reacting with the silicon source and drain contacts.

Figure 4:
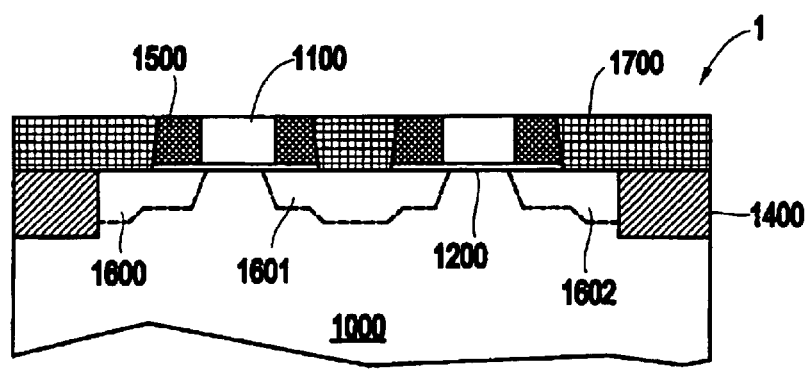
FIG. 4 is a cross-sectional view schematic diagram of a partially completed microelectronic device.
Figure 5:
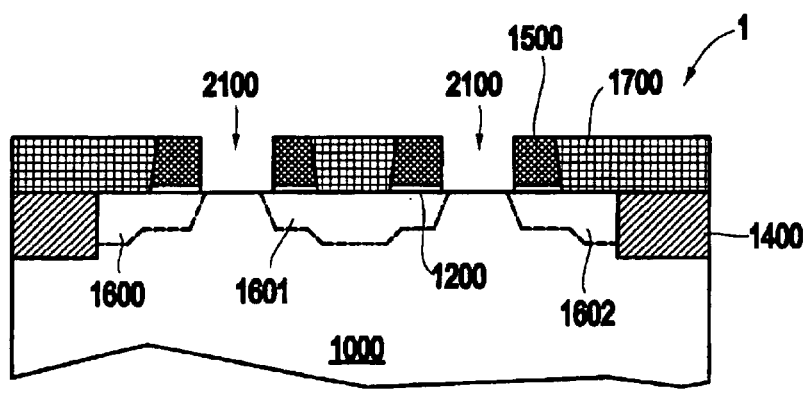
FIG. 5 is a cross-sectional view schematic diagram of a partially completed microelectronic device.

FIG. 4 illustrates the device 1 after a chemical-chemical polish process is performed to planarize the structure 1. In FIG. 5, a mask (not shown) is used to remove the dummy gate material 1100 and the sacrificial oxide 1200 in the areas occupied by the dummy gate region 1100. The oxide 1200 remains under the sidewall spacers 1500. Preferably, the invention uses a selective plasma etch or wet etch in order to only remove the exposed oxide and thereby leaving voids 2100 in the gate areas.

Figure 6:
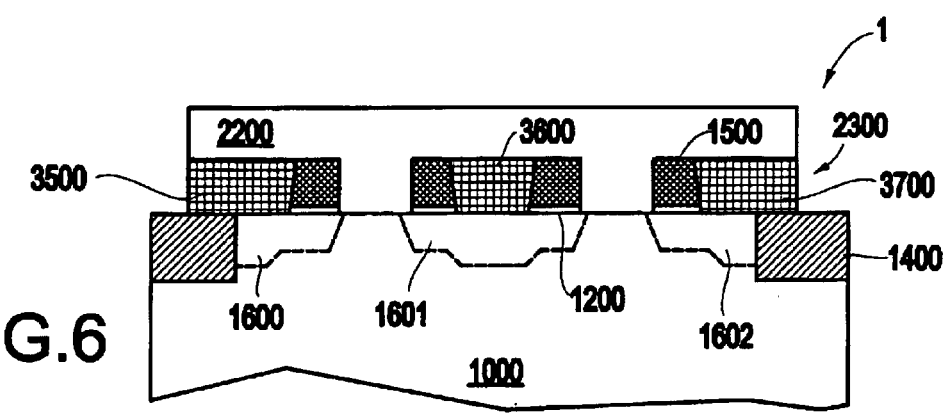
FIG. 6 is a cross-sectional view schematic diagram of a partially completed microelectronic device.
Figure 7:
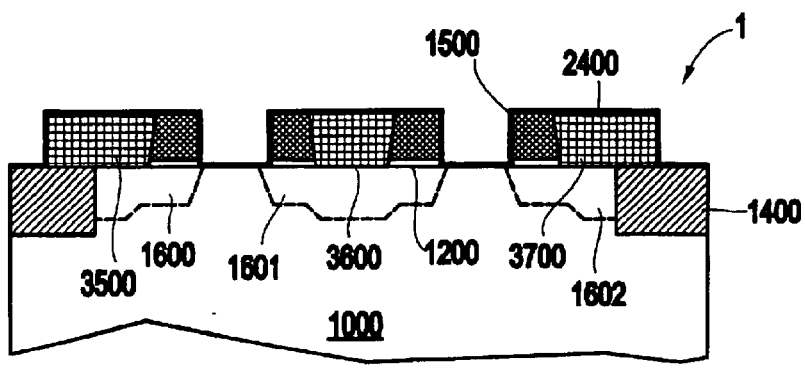
FIG. 7 is a cross-sectional view schematic diagram of a partially completed microelectronic device.

In FIG. 6, a trim mask 2200 is used to define the node plate 3500, 3700 of each capacitor. Item 2300 shows the node plate region in general. The region 3600 acts as sacrificial area that is removed later. In FIG. 7, a high-k dielectric material 2400 is conformably deposited on the structure 1. The high-k dielectric layer 2400 covers the node plates 3500 and 3700, sidewall spacers 1500, and the exposed portions of the substrate 1000.

Figure 8:
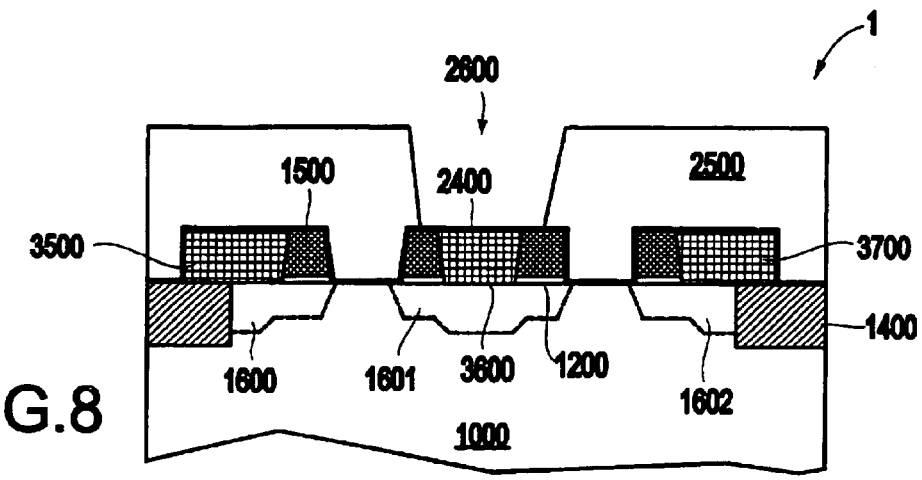
FIG. 8 is a cross-sectional view schematic diagram of a partially completed microelectronic device.
Figure 9:
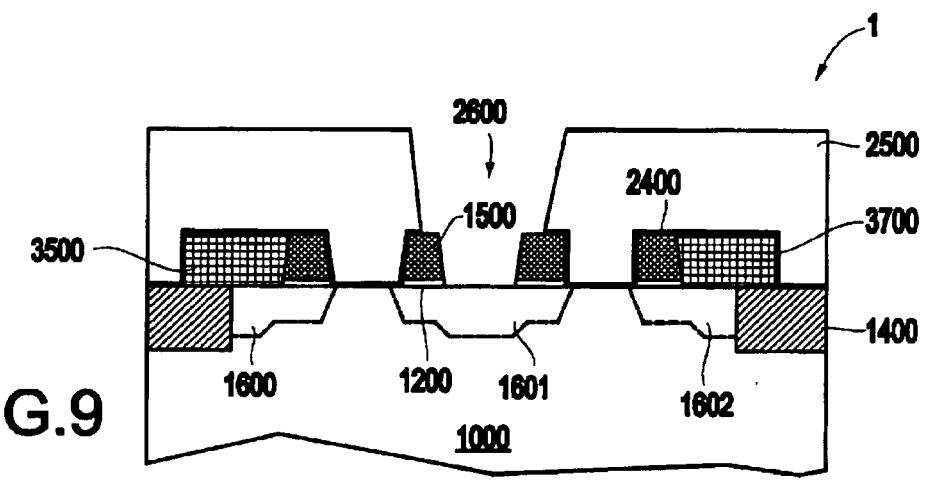
FIG. 9 is a cross-sectional view schematic diagram of a partially completed microelectronic device.
Figure 10:
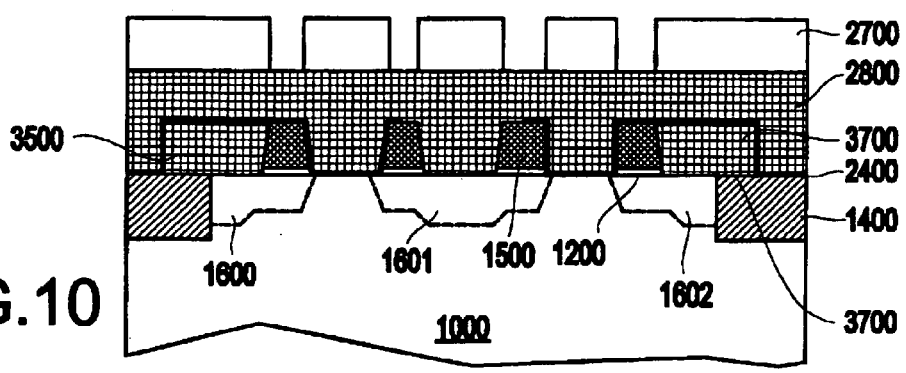
FIG. 10 is a cross-sectional view schematic diagram of a partially completed microelectronic device.

Another mask 2500, shown in FIG. 8, having an opening 2600 is used in conjunction with a selective etching process to remove the sacrificial region 3600 and the exposed high-k dielectric material 2400, as shown in FIG. 9. Then, the mask 2500 is removed. As shown in FIG. 10, another layer of metal 2800 is deposited on the structure 1 and planarized. The second metal 2800 may be the same or different material than the first metal 1700. The thickness of the metal layer 2800 can be controlled such that no polishing process is needed. Mask 2700 is then patterned above the structure.

A metal etching process is performed through the mask 2700 to etch the second metal 2800 to form capacitor plates 3000 and 3400, gates 3100 and 3300, and a common source contact 3200. The mask 2700 is then removed and replaced with an insulator. Alternatively, the mask 2700 can act as an insulator. Additional processing is performed to connect and insulate the structure from other devices, as is well-known in the art.

Figure 11:
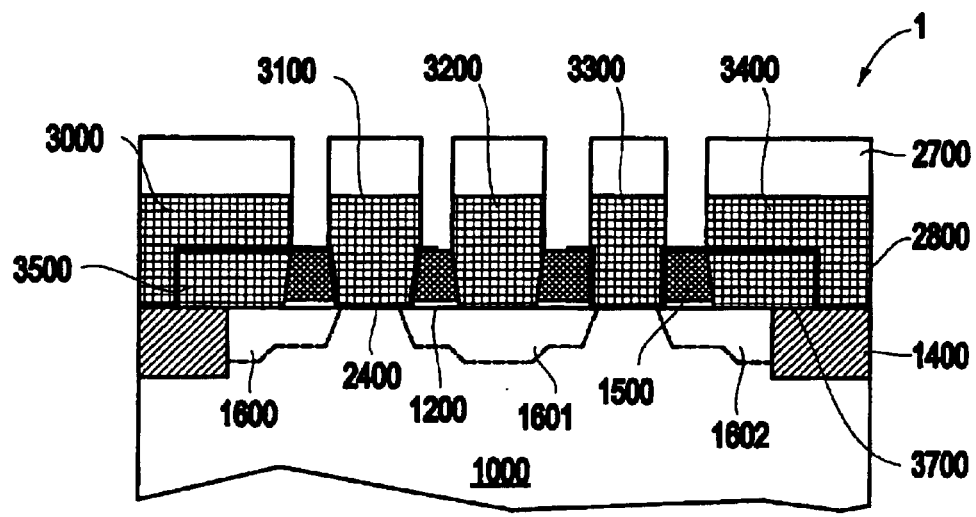
FIG. 11 is a cross-sectional view schematic diagram of a completed microelectronic device.
Figure 13:
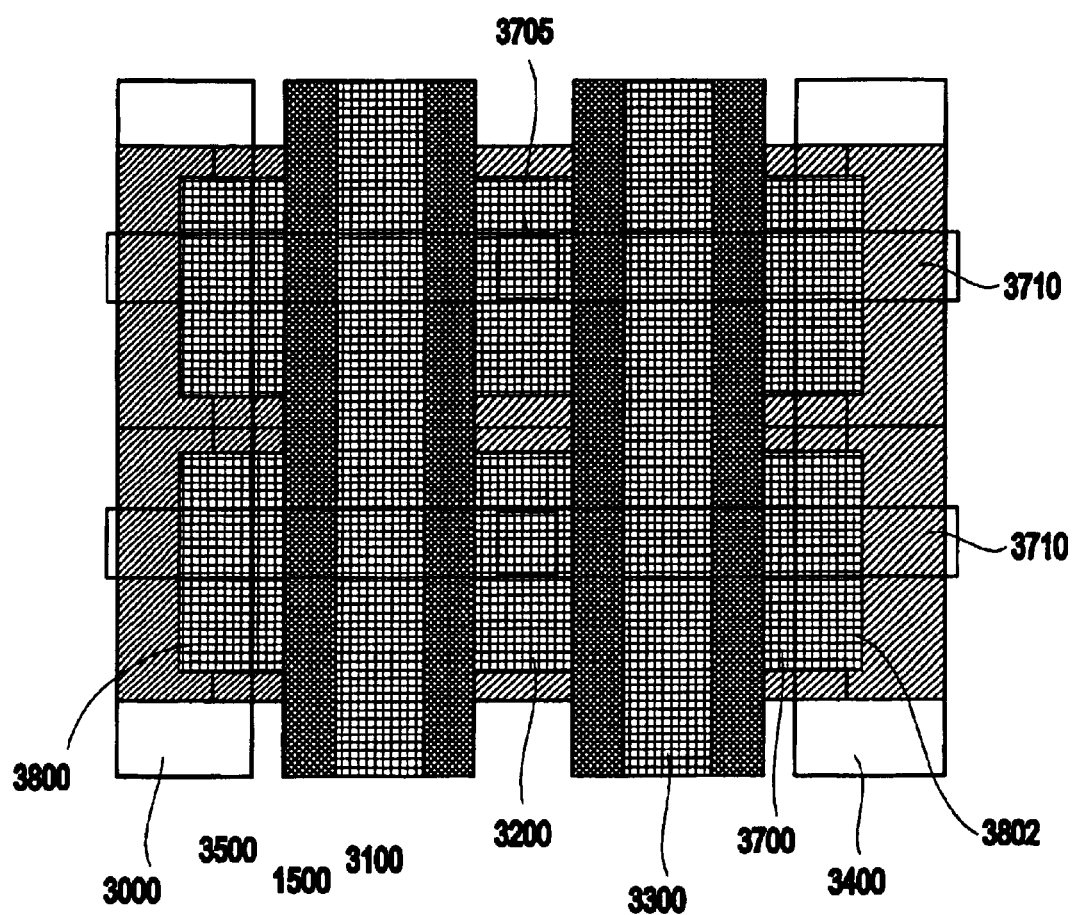
FIG. 13 is a top view schematic diagram of a completed microelectronic device of FIG. 11.

This processing forms the dual capacitor structure shown in FIGS. 11 and 13. More specifically, the metal capacitor plate 3000, insulator 2400, and metal node plate 3500 form a first capacitor. Similarly, metal capacitor plate 3400, insulator 2400, and metal node plate 3700 form a second capacitor. Drain region 1600, gate 3100, and common source 1601 comprise one transistor that makes contact with the first capacitor (3000, 2400, 3500) and drain region 1602, gate 3300, and common source 1601 comprise a second transistor that allows access to the second capacitor (3400, 2400, 3700). FIG. 13 is a top view the same structure shown in FIG. 11. In addition, FIG. 13 shows the first capacitor (3000, 2400, 3500) generally as item 3800, the second capacitor (3400, 2400, 3700) generally as item 3802. Further, FIG. 13 shown bitlines 3710 which include contacts 3705 that form electrical connections to the common source contact 3200.

Figure 12:
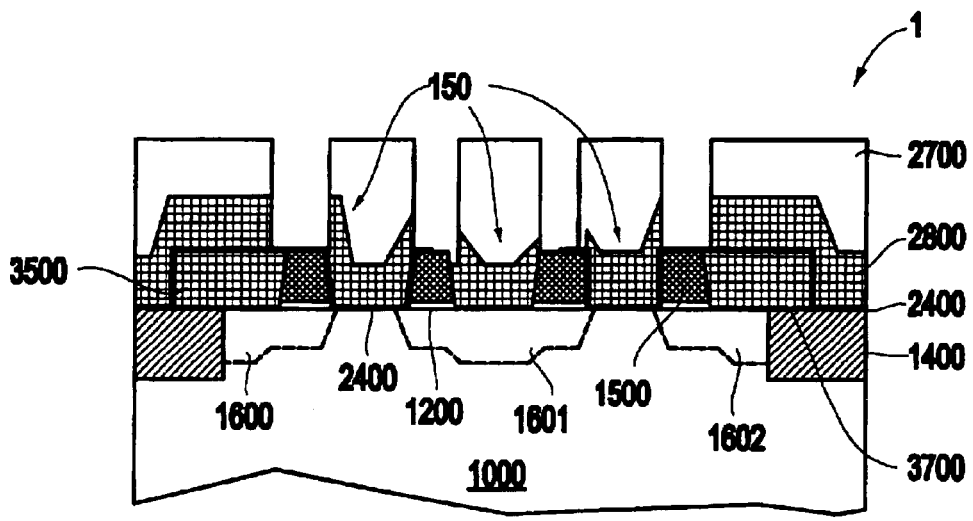
FIG. 12 is a cross-sectional view schematic diagram of a completed microelectronic device.

With the invention, the structure maintains a substantially planar structure, which allows the metal layer 2800 to completely form the upper plates, gates and source contact. Without the inventive processing, the metal layer 2800 would have an irregular (non-planar) shape, as shown in FIG. 12. More specifically, the planarization process shown in FIG. 4 establishes a planar surface that allows the remaining processing to maintain a uniform planar surface. The structure shown in FIG. 12 would have reduced yield because the contacts, capacitor plates, etc. would not form electrical connections as reliably as the inventive structure would. Therefore, the inventive structure has substantially higher yield and higher reliability when compared to conventional structures.

In addition, the invention uses the same metal layer as both the gate 3100 and the upper plates 3000, 3400 of the capacitors. By making the gate and upper plates of metal, the performance of the device is dramatically improved. Further, by using the same metal level as both the gate and the capacitor plates, the invention reduces processing costs and material costs. In addition, by decreasing the number of processing steps, the invention decreases opportunity for manufacturing defects and thereby increases yield and reliability.

While the invention has been described in terms of preferred embodiments, those skilled in the art will recognize that the invention can be practiced with modification within the spirit and scope of the appended claims.

What is claimed is:

1. An integrated circuit structure comprising:
    a capacitor having metal plates separated by an insulator; and
    a semiconductor transistor electrically connected to said capacitor and having a metal gate,
    wherein said metal gate and one of said metal plates comprise the same metal level in said integrated circuit structure.

2. The integrated circuit structure in claim 1, wherein said capacitor comprises a vertical capacitor having an upper metal plate vertically over a lower metal plate.

3. The integrated circuit structure in claim 2, wherein said metal gate and said upper metal plate comprise the same metal level in said integrated circuit structure.

4. The integrated circuit structure in claim 2, wherein said transistor includes a drain region connected to said lower metal plate.

5. An integrated circuit structure comprising:
    a pair of capacitors, each having metal plates separated by an insulator; and
    semiconductor transistors, each being electrically connected to one of said capacitors,
    wherein each of said semiconductor transistors has a metal gate, and
    wherein each said metal gate of said transistors and one of said metal plates of each of said capacitors comprise the same metal level in said integrated circuit structure.

6. The integrated circuit structure in claim 5, wherein each of said capacitors comprise a vertical capacitor having an upper metal plate vertically over a lower metal plate.

7. The integrated circuit structure in claim 6, wherein each said metal gate of said transistors and each said upper metal plate of said capacitors comprise the same metal level in said integrated circuit structure.

8. The integrated circuit structure in claim 6, wherein each of said transistors includes a drain region connected to a respective lower metal plate of an adjacent capacitor.

9. An integrated circuit structure comprising:
    a capacitor having metal plates separated by an insulator; and
    a transistor electrically connected to said capacitor and having a metal gate,
    wherein said capacitor comprises a vertical capacitor having an upper metal plate vertically over a lower metal plate, and
    wherein said metal gate and said upper metal plate comprise the same metal level in said integrated circuit structure.

10. The integrated circuit structure in claim 9, wherein said transistor includes a drain region connected to said lower metal plate.

11. An integrated circuit structure comprising:
    a pair of capacitors, each having metal plates separated by an insulator; and
    transistors, each being electrically connected to one of said capacitors,
    wherein each of said semiconductor transistors has a metal gate,
    wherein each of said capacitors comprise a vertical capacitor having an upper metal plate vertically over a lower metal plate, and
    wherein each said metal gate of said transistors and each said upper metal plate of said capacitors comprise the same metal level in said integrated circuit structure.

12. The integrated circuit structure in claim 11, wherein each of said transistors includes a drain region connected to a respective lower metal plate of an adjacent capacitor.

* * * * *